United States Patent [19]

Kawashima

[11] Patent Number: 4,766,571
[45] Date of Patent: Aug. 23, 1988

[54] SEMICONDUCTOR MEMORY DEVICE
[75] Inventor: Syoichiro Kawashima, Yokohama, Japan
[73] Assignee: Fujitsu Limited, Kawasaki, Japan
[21] Appl. No.: 706,290
[22] Filed: Feb. 27, 1985
[30] Foreign Application Priority Data
Feb. 29, 1984 [JP] Japan .................................. 59-35920
[51] Int. Cl.$^4$ ............................................ G11C 7/00
[52] U.S. Cl. ..................................... 365/189; 365/230
[58] Field of Search ................. 365/154, 189, 190, 230
[56] References Cited
U.S. PATENT DOCUMENTS

| | | | |
|---|---|---|---|
| 4,090,096 | 5/1978 | Nagami | 365/233 |
| 4,272,834 | 6/1981 | Noguchi et al. | 365/230 |
| 4,516,224 | 5/1985 | Aoyama | 365/203 |
| 4,616,344 | 10/1986 | Noguchi et al. | 365/230 |

FOREIGN PATENT DOCUMENTS 2070372 9/1981 United Kingdom .
2092851 8/1982 United Kingdom .

OTHER PUBLICATIONS

IBM Technical Disclosure Bulletin, vol. 18, No. 8, Jan. 1976, pp. 2450-2451, New York, U.S.; L. M. Arzuki: "Write/Sense for Monolithic Memories".
Patent Abstracts of Japan, vol. 3, No. 54, 10th May 1979, p. 21 E109; & JP-A-54 32 235 (Futjitsu K.K.) 09-03-79.

Primary Examiner—James W. Moffitt
Attorney, Agent, or Firm—Staas & Halsey

[57] ABSTRACT

A semiconductor memory device including a reset signal generator for generating a reset signal for resetting a bit line pair to an equal potential when a chip selection control signal represents a nonselection state of a memory chip. The reset signal has a reset period longer than a predetermined period even when the period of the chip selection control state representing the nonselection state is shorter than the predetermined period, thereby ensuring resetting the bit line pair and the shortening of accessing time.

8 Claims, 7 Drawing Sheets

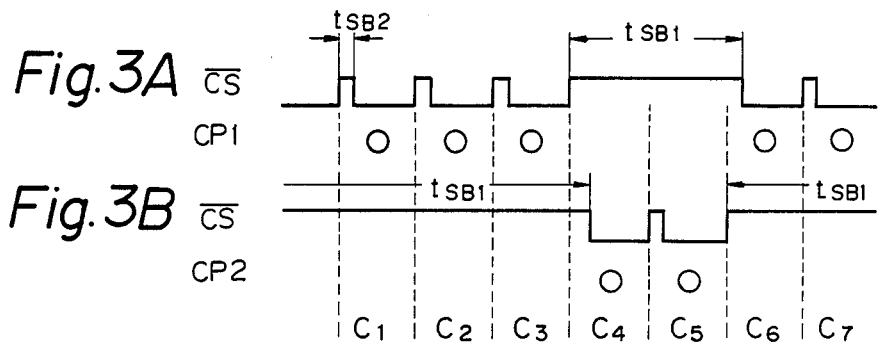
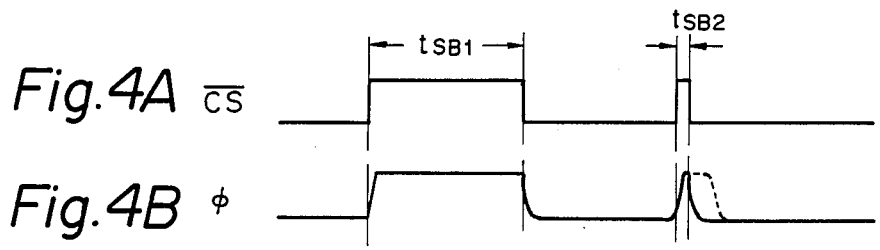
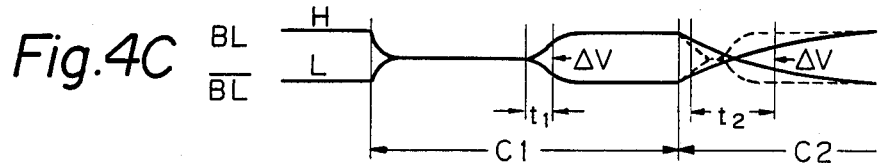

SEMICONDUCTOR MEMORY DEVICE

BACKGROUND OF THE INVENTION

The present invention relates to a semiconductor memory device, more particularly, to a semiconductor memory device ensuring the resetting of bit lines even when a chip selection control signal represents a short period of a chip nonselection state.

In general, in a semiconductor memory device, the time for readout of data from the memory cells is shortened by resetting, during chip nonselection, the bit line pairs connected to the memory cells to an equal potential. Other than the bit line pairs, a semiconductor memory device has other complimentary signal line pairs such as data bus or output line pairs of a sense amplifier. Such complementary signal line pairs are also reset during chip nonselection. In these cases, it is required that the reset of the potential of the bit line pairs or the other complementary signal line pairs be performed reliably no matter how short the period of the chip nonselection state represented by a chip selection control signal.

In the past, it has not been possible to sufficiently reset the potential of bit line pairs or the other complementary signal line pairs when the period of the chip nonselection state is short. In this case, the problem occurs of a long being necessary for reading out data from the memory cells.

SUMMARY OF THE INVENTION

The object of the present invention is, in view of the above-mentioned problems in the prior art, to provide a semiconductor memory device in which a chip selection control signal is received for resetting the bit line potential, wherein, even when the pulse width of the chip selection control signal is short, the pulse width of the reset signal is expanded so that the pulse width is at least equal to the time required for the resetting of the bit line potential, thereby shortening the readout time of data.

To attain the above object, there is provided, according to the present invention, a semiconductor memory device having a selection state and a nonselection state, in response to a control signal, the device comprising a pair of lines for transferring complementary signals, and a reset signal generator for generating a reset signal for resetting the signal lines to an equal potential when the control signal represents the non-selection state. The reset signal generating circuit is so constructed that it will generate the reset signal having a reset period longer than a predetermined time period even when the time period of the nonselection state represented by the control signal is shorter than the predetermined period.

BRIEF DESCRIPTION OF THE DRAWINGS

The above objects and features of the present invention will be more apparent from the following description of the preferred embodiment with reference to the accompanying drawings; wherein:

FIGS. 1 through 6 and 9 are diagrams for explaining the problems in the prior art, and FIGS. 10 through 13 are diagrams for explaining an embodiment of the present invention. Specifically, FIG. 1 shows a conventional static memory cell adapted to receive a reset signal;

FIG. 2 shows memory chips adapted to receive a chip nonselection signal and an address signal used to obtain the reset signal;

FIGS. 3A and 3B show different pulse widths of the chip selection control signal;

FIGS. 4A through 4C show waveforms for explaining the problem of a long accessing time;

FIG. 5 shows a conventional reset signal generating circuit;

FIG. 6 shows a conventional address buffer for generating a pair of address signals;

FIG. 9 is a graph showing an influence of the pulse width of the chip selection control signal on the pulse width of the reset signal produced by an address change;

FIG. 10 is a block circuit diagram generally showing a reset pulse generator in a semiconductor memory device according to an embodiment of the present invention;

FIG. 11 is a block diagram of a reset signal generating circuit in the reset pulse generator shown in FIG. 10;

FIG. 12 is a detailed circuit diagram of the circuit shown in FIG. 11; and

DESCRIPTION OF THE PREFERRED EMBODIMENT

Before describing the embodiment of the present invention, the problems in the prior art will first be described with reference to FIGS. 1 through 6 and 9.

Figure 1:
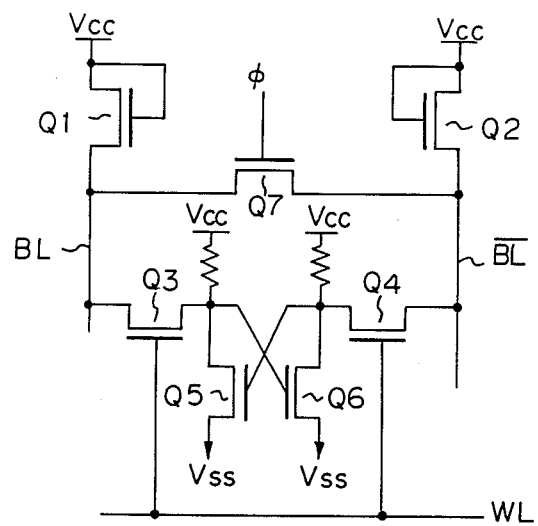

FIG. 1 is a circuit diagram showing a static memory cell in which the bit line potentials are reset by a reset signal $\phi$. In the figure, Q1 and Q2 are bit line load transistors, Q3 and Q4 transfer gate transistors which are turned on and off by the potential of the word line WL, Q5 and Q6 transistors comprising a flip-flop of the memory cell, and Q7 a reset transistor for resetting the potential difference between the bit lines BL and $\overline{BL}$ by the reset signal.

The reset signal $\phi$ is usually obtained by utilizing a chip selection control signal $\overline{CS}$ or a change of an address signal.

Figure 2:
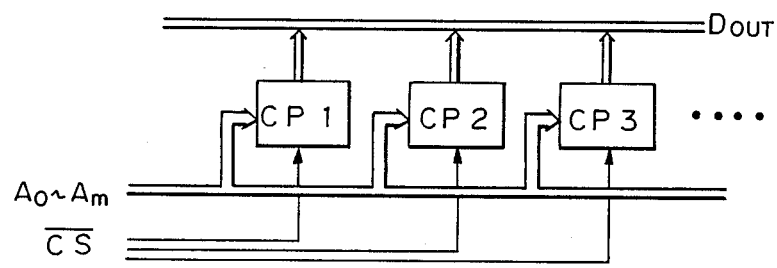

FIG. 2 shows memory chips adapted to receive a chip selection control signal $\overline{CS}$ and an address signal. The chip selection control signal $\overline{CS0}$ is used for power reduction of nonselected memory chips CP1, CP2, or CP3 and for making the outputs of the nonselected memory chips CP1, CP2, or CP3 have high impedance. The chip selection control signal $\overline{CS}$ is also used for obtaining the reset signal $\phi$ as later described in more detail.

FIGS. 3A and 3B show different pulse widths of the chip selection control signal $\overline{CS}$. In FIGS. 3A and 3B, the memory chip CP1 is selected during reading periods C1, C2, C3, C6, C7, ..., as illustrated by small circles. Also, the memory chip CP2 is selected during reading periods C4 and C5. During a nonselected period, the chip selection control signal $\overline{CS}$ is always at a high potential, so that its pulse width $t_{SB1}$ is long. Contrary to this, at the beginning of each reading period, a short pulse width $t_{SB2}$ of the chip selection control signal $\overline{CS}$ is applied to the selected memory chip to reset the bit line pairs.

FIGS. 4A, B, and C are waveform diagrams for explaining the operation of the circuit of FIG. 1. In the figures, C1 shows a first readout cycle and C2 a second readout cycle. In the first readout cycle C1, a chip nonselection signal of a sufficiently long time is given (when the time $\overline{CS}$=High is long). In the second readout cycle $\overline{C2}$, a chip selection control signal CS of a short time is given. Assume that the reset signal $\phi$ is generated from the chip selection signal $\overline{CS}$. Then, in the first readout cycle C1 wherein the long chip selection control signal $\overline{CS}$ is given, the standby time of the memory cells in the nonselected chip is $t_{SB1}$, which is sufficiently long, so that the bit lines BL and $\overline{BL}$ are reliably reset to an equal potential by the reset signal $\phi$, and thus the potential difference $\Delta V$ required for the readout of data between the bit lines BL and $\overline{BL}$ is obtained in the short time $t_1$ by the rise of the word line WL. However, in the second readout cycle C2 wherein the short chip selection control signal $\overline{CS}$ is given, the standby time $t_{SB2}$ of the memory cells is shorter than $t_{SB1}$ and the word line WL rises while the bit lines BL and $\overline{BL}$ are still not fully reset to an equal potential. As a result, a long time $t_2$ is taken until the potential difference $\Delta V$ necessary for readout of data between the bit lines BL and $\overline{BL}$ can be obtained.

Figure 5:
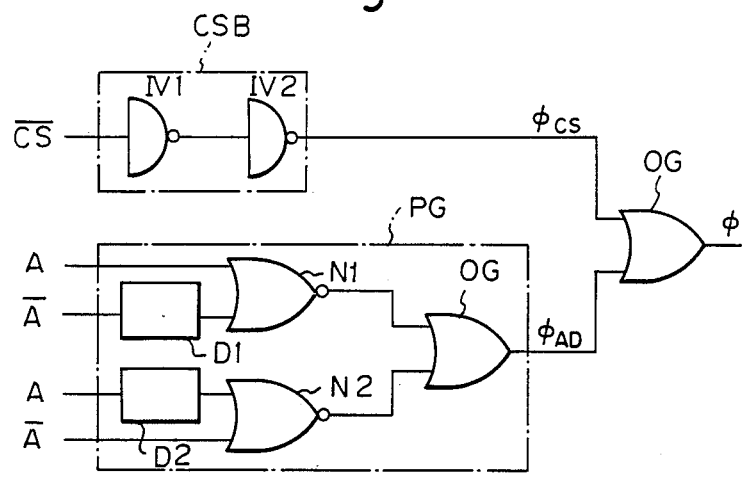

The reset signal $\phi$ is obtained, in practice, either from the chip selection control signal $\overline{CS}$ or from an address change detection, as in FIG. 5 which shows a conventional reset signal generating circuit. In FIG. 5, the reset signal $\phi$ is obtained as a logical OR of an output $\phi_{CS}$ of a buffer circuit CSB and an output $\phi_{AD}$ of a pulse generating circuit PG. The buffer circuit CSB includes two inverters IV1 and IV2 which operate to shape the waveform of the chip selection control signal $\overline{CS0}$ to obtain a first reset signal $\phi_{CS}$. The pulse generating circuit PG includes two delay circuits D1 and D2, two NOR gates N1 and N2, and an OR gate OG. The pulse generating circuit PG is well known and is described in, for example, European Patent Unexamined Publication No. 0098164, published on Jan. 11, 1984. Briefly, this reference discloses that the pulse generating circuit PG generates a second reset signal $\phi_{AD}$ in response to an address change in the address signal pairs A and $\overline{A}$.

The address signal pairs A and $\overline{A}$ are reset to an equal high potential when the chip selection control signal $\overline{CS}$ has a sufficiently long high level potential, i.e., when the memory chip is in a nonselected state, in order to speed up the next address change when the memory chip is selected. This reset of the address signal pairs A and $\overline{A}$ is realized by a conventional address buffer circuit, as shown in FIG. 6.

Figure 6:
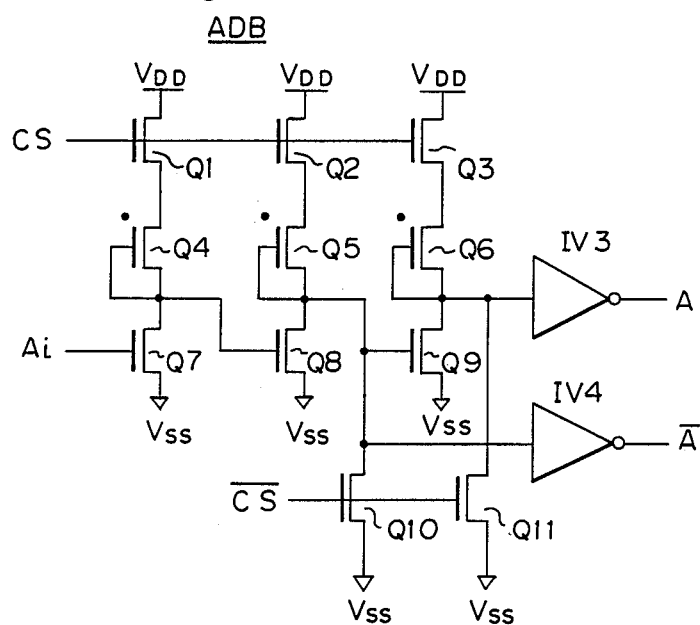

In FIG. 6, the address buffer circuit includes enhancement MOS transistors Q1 through Q3 and Q7 through Q11, depletion MOS transistors Q4 through Q6, and two inverters IV3 and IV4. The MOS transistors Q1 through Q3 operatively receive at their gates a signal CS which is an inverted signal of the chip selection control signal $\overline{CS}$. The MOS transistors Q10 and Q11 operatively receive at their gates the chip selection control signal $\overline{CS}$. The transistors Q7 operatively receives at its gate an input address signal $A_i$. While the signal CS is at a big potential, the transistors Q1 through Q3 are in an ON state and the transistors Q10 and Q11 are in an OFF state. Therefore, an address change in the input address signal $A_i$ appears at the outputs of the inverters IV3 and IV4 as the address signals A and $\overline{A}$ having different potentials.

While the signal CS is at a low potential, however, since the transistors Q1 through Q3 are in an OFF state, and since the transistors Q10 and Q11 are in an ON state, the potentials of the address signals A and $\overline{A}$ are both at a high potential regardless of any address change in the input address signal $A_i$.

Accordingly, if the pulse width of the chip selection control signal $\overline{CS}$ is sufficiently long, the address signal pair A and $\overline{A}$ are both at a high potential, and thus the pulse generating circuit PG in the circuit shown in FIG. 5 cannot generate the second reset signal $\phi_{AD}$, regardless of any address change in the input address signal $A_i$. In this case, the reset signal $\phi$ is obtained only from the first reset $\phi_{CS}$.

Contrary to this, if the pulse width of the chip selection control signal $\overline{CS}$ is very short, or if the signal $\overline{CS}$ is at a low potential, the potentials of the address signals A and $\overline{A}$ change in response to any address change in the input address signal $A_i$, so that the second reset signal $\phi_{AD}$ is generated. When the second reset signal $\phi_{AD}$ has a longer pulse width than that of the first reset signal $\phi_{CS}$, the reset signal $\phi$ is the second reset signal $\phi_{AD}$.

Figure 7:
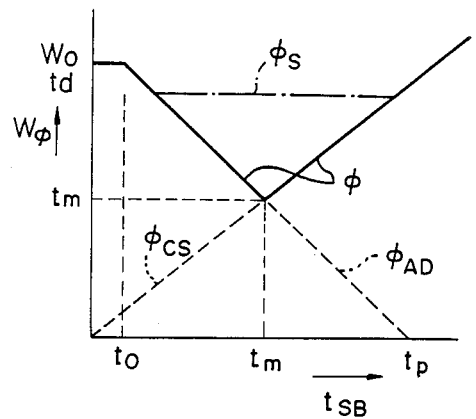
FIG. 7 is a graph showing a relationship between the pulse width of the chip selection control signal and the pulse width of the reset signal.

FIG. 7 is a graph showing the relationship between the pulse width $t_{SB}$ of the chip selection signal $\overline{CS}$ and the pulse width $W_\phi$ of the reset signal $\phi$. As shown in FIG. 7, when the pulse width $T_{SB}$ is smaller than a predetermined value $t_O$, the pulse width of the second reset signal $\phi_{AD}$ is constant, i.e., $W_O$. When the pulse width $t_{SB}$ is greater than $t_O$, the pulse width of the second reset signal $\phi_{AD}$ is linearly decreased in accordance with the linear increase of the pulse width $t_{SB}$ of the chip selection control signal $\overline{CS}$, until the pulse width $t_{SB}$ reaches a value $t_p$. When the pulse width $t_{SB}$ is greater than $t_p$, the second reset signal $\phi_{AD}$ is not generated even when the input address signal $A_i$ is changed. The pulse width of the first reset signal $\phi_{CS}$, of course, linearly increases in accordance with the increase of the pulse width $t_{SB}$. The reset signal $\phi$ is the logical OR of the first reset signal $\phi_{CS}$ and the second reset signal $\phi_{AD}$, as mentioned before. Therefore, as illustrated by a solid curve, the pulse width of the reset signal $\phi$ is obtained from the second reset signal $\phi_{AD}$ and is decreased, when the pulse width $t_{SB}$ increases from the value $t_O$ to a value $t_m$, at which both pulse widths of the first and second reset signals $\phi_{CS}$ and $\phi_{AD}$ are equal to $t_m$. When the pulse width $t_{SB}$ is greater than the value $t_m$, the pulse width of the reset signal $\phi$ is obtained from the first reset signal $\phi_{CS}$.

Accordingly, the pulse width of the reset signal $\phi$ is at a minimum when the chip selection control signal $\overline{CS}$ has the pulse width $t_m$. As described with reference to FIG. 2, if the pulse width of the reset signal $\phi$ is too small, the bit line pair is not shorted fully and thus the reading access time becomes long.

Figure 8:
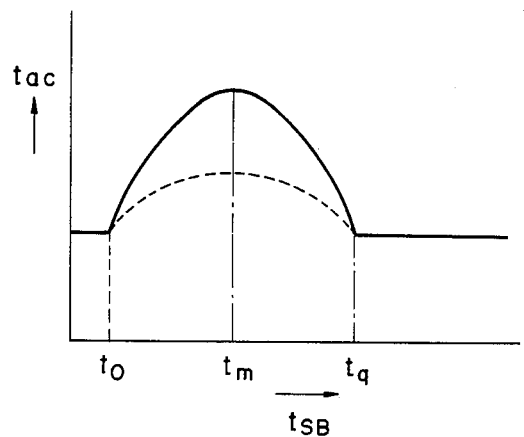
FIG. 8 is a graph showing a relationship between the pulse width of the chip selection control signal and the accessing time.

FIG. 8 shows the relationship between the pulse width $t_{SB}$ of the chip selection control signal $\overline{CS}$ and the accessing time $t_{ac}$. As can be seen from FIG. 8, the accessing time $t_{ac}$ is at a maximum when the pulse width of the chip selection control signal $\overline{CS}$ is equal to the value $t_m$. When the pulse width $t_{SB}$ is shorter than the value $t_O$, the reset signal $\phi$ is derived from the second reset signal $\phi_{AD}$ which, in this case, is not effected from the chip selection control signal $\overline{CS}$, so that a constant short accessing time is obtained. Also, when the pulse width $t_{SB}$ is longer than a predetermined value $t_q$, the bit line pair BL and $\overline{BL}$ are sufficiently reset before accessing so that the constant short accessing time is obtained.

The main object of the present invention is to shorten the accessing time when the pulse width $t_{SB}$ of the chip selection control signal $\overline{CS}$ is as short as the period between the value $t_O$ and $t_q$, as illustrated by the dashed curve in FIG. 8.

Figure 9:
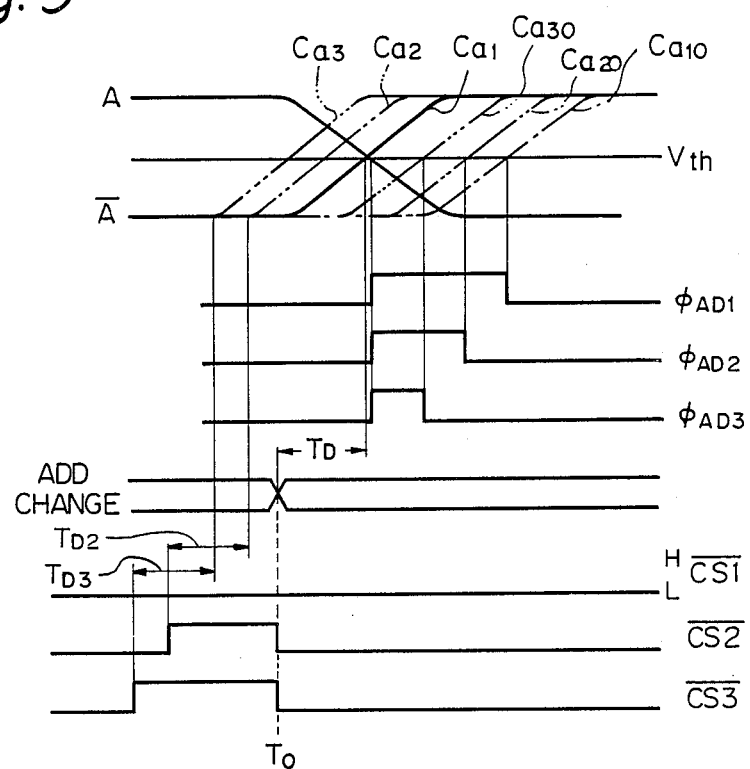

The decrease of the pulse width of the second reset signal $\phi_{AD}$ in accordance with the increase of the pulse width of the chip selection control signal $\overline{CS}$ is more apparent from FIG. 9, in which an influence of the pulse width $t_{SB}$ of the chip selection control signal $\overline{CS}$ on the pulse width of the reset signal produced by an address change is shown. In FIG. 9, the address signals A and $\overline{A}$ are changed after a delay time $T_{D1}$ from an address change at a time TO, when the chip selection control signal $\overline{CS}$ is at the low level L before the time TO such as shown as $\overline{CS1}$. In this case, the curve of the address signal $\overline{A}$ is represented in the figure by a notation $C_{a1}$. However, when the chip selection control signal $\overline{CS}$ is at the high level H before the time $T_O$, the address signal $\overline{A}$ is raised earlier than the curve $C_{a1}$. The longer the the pulse width of the chip selection control signal $\overline{CS}$, the earlier the address signal A raises. In FIG. 9, $T_{D2}$ or $T_{D3}$ represent delay times from the rising of the chip selection control signal such as shown by $\overline{CS2}$ or $\overline{CS3}$. Thus, the address signal $\overline{A}$ rises by a curve $C_{a2}$ or $C_{a3}$ in response to the control signal $\overline{CS2}$ or $\overline{CS3}$. By the delay circuit D1 in the circuit shown in FIG. 5, the curve $C_{a1}$, $C_{a2}$, or $C_{a3}$ is delayed to become a curve $C_{a10}$, $C_{a20}$, or $C_{a30}$, respectively. Taking a threshold voltage Vth, a second reset signal $\phi_{AD1}$, $\phi_{AD2}$, or $\phi_{AD3}$ is obtained from the curve $C_{a10}$, $C_{a20}$, or $C_{a30}$, respectively. As will be seen, the pulse width of the second reset signal $\phi_{AD}$ decreases in accordance with the increase of the pulse width of the chip selection control signal $\overline{CS}$.

Figure 10:
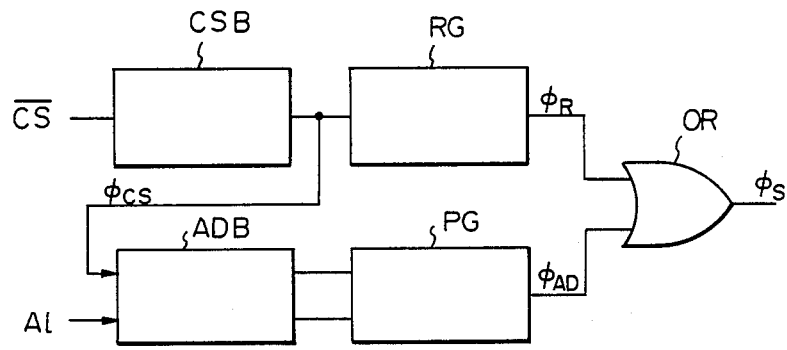

FIG. 10 is a block circuit diagram generally showing a reset pulse generator in a semiconductor memory device according to an embodiment of the present invention. In FIG. 10, the buffer circuit CSB, the address buffer circuit ADB, and the pulse generating circuit PG are the same as those in the conventional circuits shown in FIGS. 5 and 6. According to the embodiment of the present invention, a reset signal generating circuit RG is provided between the buffer circuit CSB and the OR gate OG.

Figure 11:
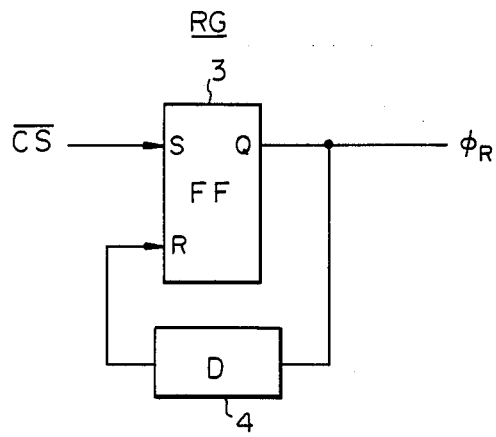

The fundamental constitution of the reset signal generating circuit RG is shown in FIG. 11. In FIG. 11, the reset signal generating circuit RG is provided with an R-S flip-flop 3 and a delay circuit 4. The R-S flip-flop 3 receives a chip selection control signal $\overline{CS}$ at its set terminal S and is connected to the output of the delay circuit 4 at its reset terminal R. The delay circuit 4 delays the signal obtained from the Q output of the flip-flop 3 by exactly the predetermined time needed for quickly resetting the potential of the bit line pairs. The potential at the output Q of the flip-flop 3 rises in response to the rise of the chip selection control signal $\overline{CS}$. After the elapse of the above-mentioned predetermined time from the potential rise, the potential at the output Q is lowered by the delay circuit 4. Thus, a bit line reset signal $\phi_R$ is obtained at the output Q of the flip-flop 3.

Figure 12:
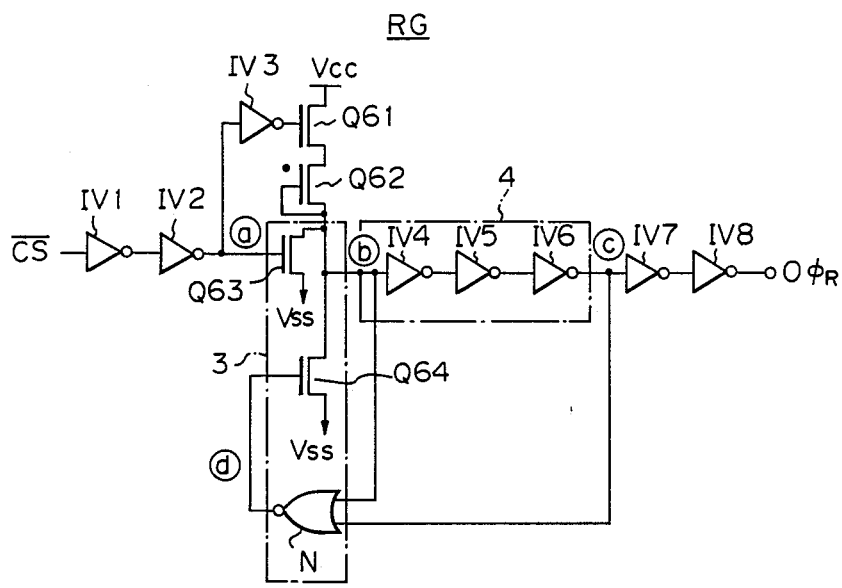
Figures 13A, 13B, 13C, 13D, 13E, 13F, 13G, 13H:
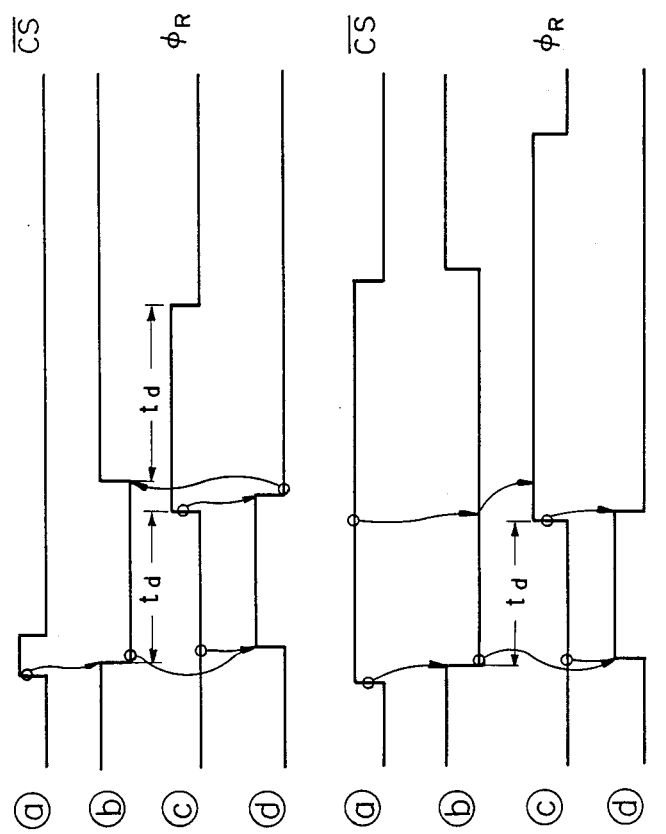
FIGS. 13A through 13H are waveform diagrams explaining the operation of the circuit shown in FIG. 12.

FIG. 12 is a circuit diagram showing in more detail the reset signal generating circuit RG.

In FIG. 12 transistors Q61, Q62, and Q63 are connected in series through their drains and sources between power sources $V_{CC}$ and $V_{SS}$. The drain of the transistor Q64 and the drain of the transistor Q63 are connected. The source of the transistor Q64 is connected to the power source $V_{SS}$. In this way, the transistors Q63 and Q64 comprise a NOR gate. The gate of the transistor Q61 is supplied with the chip selection control signal $\overline{CS}$ through inverters IV1, VI1, and IV3. The gate of the transistor Q63 is supplied with the chip selection control signal $\overline{CS}$ through the inverters IV1 and IV2. The commonly connected drains of the transistors Q63 and Q64 are connected to a first input of a NOR gate N of the same construction of the transistors Q63 and Q64 and are connected to an output terminal O through the inverters IV4 to IV8. The output of the inverter IV6 is connected to the second input of the NOR gate N. The output of the NOR gate N is connected to the gate of the transistor Q64. The transistor Q62 is a depletion transistor and its gate and source are shortcircuited. The transistors Q62, Q63, and Q64 are N channel enhancement transistors.

The transistors Q61 and Q63 form a push-pull circuit, in which one is OFF when the other is ON, and work as a waveshaping circuit. The transistor Q62 acts as a current limiting transistor in the transitional period where both Q61 and Q63 are ON. The transistors Q63 and Q64 and the NOR gate N form the flip-flop 3 which is set by the rise of the chip selection control signal $\overline{CS}$ supplied to the gate of Q63 and reset by the rise of the output of the NOR gate N supplied to the gate of Q64. The inverters IV4, IV5, and IV6 form a delay circuit 4 which delays the output of the flip-flop 3 by exactly the time necessary for resetting the bit line potential.

The operation of the circuit of FIG. 12 will be explained with reference to FIGS. 13A through 13H. FIGS. 13A through 13D show the case where the pulse width of the chip selection control signal $\overline{CS}$ is short and FIGS. 13E through 13H show the case where the pulse width of the chip selection control signal $\overline{CS}$ is sufficiently long.

In FIGS. 13A through 13D, when the chip selection control signal $\overline{CS}$ rises, the potential at a point ⓐ of FIG. 12 rises through the inverters IV1 and IV2. By this rise, the transistor Q63 is turned ON and the potential of point ⓑ of FIG. 12 falls. The NOR gate N is raised in its output point ⓓ by the low level of point ⓑ and point ⓒ of FIG. 12. Thus, the transistor Q64 is turned ON and the output point ⓑ of the flip-flop 3 is latched to the low level. For this reason, even if the chip nonselection signal $\overline{CS}$ falls, the potential of point ⓑ is held at the low level. The change from the high level to the low level at point ⓑ manifests itself through the inverters IV4, IV5 and IV6 as a change from the low level to high level at point ⓒ after a predetermined time $t_d$. When point ⓒ becomes at a high level, the output of the NOR gate N, i.e., point ⓓ, falls to a low level. Thus, the transistor Q64 becomes OFF, the flip-flop 3 is reset, and the potential of point ⓑ becomes the high level. Therefore, after the predetermined time $t_d$, the potential of point ⓒ falls to the low level. The pulse width at point ⓒ is the predetermined time $t_d$ or more and is output as the bit line reset signal $\phi_R$ through the inverters IV7 and IV8 to the output terminal O.

In FIGS. 13E through 13H, the flip-flop 3 is set by the rise of the potential of point ⓒ in the same way as in FIGS. 13A through 13D. Unlike the case of FIGS. 13A through 13D, however, after the predetermined time $t_d$ from the fall of the potential of point ⓑ, the potential of point c rises and, even if the potential of output point ⓓ of the NOR gate N falls, the chip selection control signal $\overline{CS}$ remains at the high level. Therefore, since the level of point ⓐ is high, the transistor Q63 remains on and the potential of point ⓑ is held at the low level. In this case, the potential of point ⓒ, and therefore the potential at the output terminal O, follows the wide pulse width of the chip selection control signal $\overline{CS}$. That is, the pulse width of the bit line reset signal $\phi_R$ is as wide as the pulse width of the chip selection control signal $\overline{CS}$.

Accordingly, even when the second reset signal $\phi_{AD}$ has a decreased pulse width decreased due to the chip selection control signal $\overline{CS}$ as explained with reference to FIG. 9, the bit line reset signal $\phi_R$ having the elongated or the longer pulse width as explained with reference to FIGS. 13A through 13H is used, through the OR gate OR in FIG. 10, as the reset signal $\phi_S$.

Since the minimum pulse width of the reset signal $\phi_R$ is greater than the predetermined time $t_d$ necessary for quickly resetting the potential of the bit line pair, as illustrated in FIG. 7 by a dash-dot line, the accessing time $t_{ac}$ when the chip selection control signal $\overline{CS}$ has a pulse width between $t_o$ and $t_q$ in FIG. 8 can be shortened. In other words, as shown in FIGS. 4B and 4C by dash line curves, the pulse width $t_{SB2}$ of the chip selection control signal $\overline{CS}$ is elongated, and the bit line pair is quickly reset, so that the accessing time is shortened in comparison with the prior art.

The reset signal generating circuit shown in FIG. 12 may be used not only for resetting the bit line pairs in a semiconductor memory device having static memory cells shown in FIG. 1, but may also be used as a reset circuit in other semiconductor memory devices. For example, any other complementary signal line pairs such as data bus or output line pairs of a sense amplifier also may be reset by the reset signal generating circuit according to the present invention. Further, it may be applied to semiconductor circuits in general wherein chip selection signals are received and a reset signal is generated upon chip nonselection.

As is clear from the above explanation, according to the present invention, in a semiconductor memory device in which a chip selection control signal is received for resetting the bit line potential, even when the pulse width of the chip selection control signal is short, the pulse width of the reset signal is delayed until the pulse width is at least equal to the time required for the resetting of the bit line potential, thereby shortening the readout time of data.

What is claimed is:

1. A semiconductor memory device comprising:
   means for receiving a chip selection control signal having a first level and a second level each with a respective period;
   a plurality of memory cells;
   pairs of signal line means, respectively connected to corresponding ones of said memory cells, for transferring complementary signals to and from the corresponding ones of said memory cells;
   reset means, operatively connected to said pairs of signal line means, for resetting each pair of said pairs of signal line means to an equal potential in response to said chip selection control signal; and
   reset signal generator means, operatively connected to said reset means, for generating a first reset signal in response to a change of said chip selection control signal from said first level to said second level such that said first reset signal has a pulse width longer than the period of said second level when the period of said second level is shorter than a predetermined period, and so that said first reset signal has a pulse width substantially the same period as the period of said second level when the period of said second level is longer than the predetermined period.

2. A semiconductor memory device as set forth in claim 1, having a selected state and a nonselected state, further comprising:
   an address buffer circuit means for providing, as said complementary signals, complementary address signals which are reset to an equal potential during the nonselected state;
   pulse generating circuit means for generating a second reset signal in response to a change of said complementary address signals; and
   means for resetting said pairs of signal line means by the longer of said first and second reset signals.

3. A semiconductor memory device as set forth in claim 2, wherein said pulse generating circuit means includes means for decreasing a pulse width of said second reset signal in response to a time period of said nonselected state increasing.

4. A semiconductor memory device as set forth in claim 1, wherein said pairs of signal line means comprise bit line pairs.

5. A semiconductor memory device as set forth in claim 1, wherein said reset signal generator means comprises:
   flip-flop means, having a set state and a reset state, for receiving said chip selection control signal and for providing said first reset signal while in the set state; and
   delay circuit means for delaying the first reset signal provided by said flip-flop means, for resetting said pairs of signal line means, and for placing said flip-flop in the reset state.

6. The device of claim 5, wherein said delay circuit means comprises a plurality of inverters connected in series, said plurality of inverters having an input and an output.

7. The device of claim 6, wherein said flip-flop means comprises a set-reset type flip-flop including:
   a parallel connection of two enhancement type transistors having commonly connected sources and commonly connected drains, a gate of a first one of the transistors being connected to receive said chip selection control signal; and
   a NOR gate having inputs respectively connected to receive the input and the output of said series connection of inverters and an output connected to a gate of a second one of the transistors.

8. The device of claim 2, further comprising:
   buffer means for receiving said chip selection control signal and for outputting a corresponding signal to said reset signal generator means and to said address buffer circuit means, said address buffer circuit means includes means for receiving an address signal and outputting said complementary address signal to said pulse generator means in accordance with said address signal and said signal corresponding to said control signal, and an OR gate means for receiving said first and second reset signals.

* * * * *